US011410958B2

(12) United States Patent
Shim et al.

(10) Patent No.: US 11,410,958 B2
(45) Date of Patent: Aug. 9, 2022

(54) SEMICONDUCTOR PACKAGE

(71) Applicant: SAMSUNG ELECTRONICS CO., LTD., Suwon-si (KR)

(72) Inventors: Jungho Shim, Suwon-si (KR); Han Kim, Suwon-si (KR); Chulkyu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/201,538

(22) Filed: Mar. 15, 2021

(65) Prior Publication Data
US 2021/0202426 A1 Jul. 1, 2021

Related U.S. Application Data

(63) Continuation of application No. 16/682,084, filed on Nov. 13, 2019, now Pat. No. 10,985,126.

(30) Foreign Application Priority Data

Nov. 21, 2018 (KR) .................. 10-2018-0144383

(51) Int. Cl.
*H01L 23/00* (2006.01)
*H01L 23/538* (2006.01)
(Continued)

(52) U.S. Cl.
CPC ............ *H01L 24/24* (2013.01); *H01L 21/486* (2013.01); *H01L 21/568* (2013.01); *H01L 21/6836* (2013.01); *H01L 23/147* (2013.01); *H01L 23/3128* (2013.01); *H01L 23/5381* (2013.01); *H01L 23/5385* (2013.01); *H01L 23/5386* (2013.01); *H01L 24/13* (2013.01); *H01L 24/16* (2013.01); *H01L 24/19* (2013.01); *H01L 25/16* (2013.01); *H01L 25/18* (2013.01); *H01L 2224/13111* (2013.01); *H01L 2224/16227* (2013.01); *H01L 2224/16235* (2013.01); *H01L 2224/24137* (2013.01); *H01L 2924/1432* (2013.01); *H01L 2924/1434* (2013.01);
(Continued)

(58) Field of Classification Search
CPC ...... H01L 24/24; H01L 21/486; H01L 21/568
See application file for complete search history.

(56) References Cited

U.S. PATENT DOCUMENTS 9,443,824 B1 9/2016 We
9,911,465 B1 3/2018 Camarota et al.
(Continued)

*Primary Examiner* — Errol V Fernandes
(74) *Attorney, Agent, or Firm* — Sughrue Mion, PLLC

(57) ABSTRACT

A semiconductor package includes a first connection structure having first and second surfaces and including a first redistribution layer, a first semiconductor chip disposed on the first surface and having a first connection pad electrically connected to the first redistribution layer, a second semiconductor chip disposed around the first semiconductor chip on the first surface and having a second connection pad electrically connected to the first redistribution layer, an interconnection bridge disposed on the second surface to be spaced apart from the second surface and connected to the first redistribution layer through a connection member to electrically connect the first and second connection pads to each other, and a second connection structure disposed on the second surface to embed the interconnection bridge and including a second redistribution layer electrically connected to the first redistribution layer.

20 Claims, 10 Drawing Sheets

(51) Int. Cl.

| | |
|---|---|
| *H01L 23/14* | (2006.01) |
| *H01L 23/31* | (2006.01) |
| *H01L 25/18* | (2006.01) |
| *H01L 25/16* | (2006.01) |
| *H01L 21/683* | (2006.01) |
| *H01L 21/56* | (2006.01) |
| *H01L 21/48* | (2006.01) |

(52) U.S. Cl.
 CPC ............... *H01L 2924/19041* (2013.01); *H01L 2924/19042* (2013.01); *H01L 2924/19102* (2013.01)

(56) References Cited

U.S. PATENT DOCUMENTS

| | | |
|---|---|---|
| 2015/0364422 A1 | 12/2015 | Zhai et al. |
| 2016/0141234 A1 | 5/2016 | We et al. |
| 2016/0300815 A1 | 10/2016 | Kim |
| 2018/0068978 A1 | 3/2018 | Jeng |
| 2018/0175001 A1 | 6/2018 | Pyo |
| 2019/0051633 A1 | 2/2019 | Bhagavat |

SEMICONDUCTOR PACKAGE

CROSS-REFERENCE TO RELATED APPLICATION(S)

This application is a continuation application of U.S. patent application Ser. No. 16/682,084, filed Nov. 13, 2019, which claims benefit of priority to Korean Patent Application No. 10-2018-0144383 filed on Nov. 21, 2018 in the Korean Intellectual Property Office, the disclosure of which are incorporated herein in their entirety by reference.

TECHNICAL FIELD

The present disclosure relates to a semiconductor package.

BACKGROUND

The interposer market is growing, due to high-specifications of a set and the adoption of high bandwidth memory (HBM). Currently, silicon is a main material of an interposer. For example, a semiconductor package using an interposer is manufactured by surface-mounting a die on a silicon-based interposer and molding the surface-mounted die with a molding material.

SUMMARY

An aspect of the present disclosure is to provide a semiconductor package which includes a connection structure in which an interconnection bridge, capable of replacing a conventional interposer, is embedded. In spite of the embedded interconnection bridge, the semiconductor package may control warpage and may be excellent in yield and processabiliity, low in cost, and free of process and yield issues on a fine pattern.

One proposal of the present disclosure is to provide a semiconductor package in which a first connection structure is directly disposed on a plurality of semiconductor chips, an interconnection bridge is surface-mounted on the first connection structure to electrically connect the plurality of semiconductor chips to each other, and a second connection structure is disposed on the first connection structure to embed the interconnection bridge.

According to an aspect of the present disclosure, a semiconductor package includes a first connection structure having a first surface and a second surface opposing the first surface and including a first redistribution layer, a first semiconductor chip, disposed on the first surface of the first connection structure, having a first connection pad electrically connected to the first redistribution layer, a second semiconductor chip, disposed around the first semiconductor chip on the first surface of the first connection structure, having a second connection pad electrically connected to the first redistribution layer, an interconnection bridge disposed on the second surface of the first connection structure to be spaced apart from the second surface of the first connection structure and connected to the first redistribution layer through a connection member to electrically connect the first and second connection pads to each other, and a second connection structure, disposed on the second surface of the first connection structure to embed the interconnection bridge, including a second redistribution layer electrically connected to the first redistribution layer.

According to an aspect of the present disclosure, a semiconductor package includes a first semiconductor chip having a first active surface on which a first connection pad is disposed, a second semiconductor chip, disposed around the first semiconductor chip, having a second active surface on which a second connection pad is disposed, a first connection structure including a first insulating layer disposed on the first and second active surfaces, a first redistribution layer disposed on the first insulating layer, and first connection vias penetrating through the first insulating layer and respectively, electrically connecting the first redistribution layer to the first and second connection pads, an interconnection bridge disposed on the first connection structure and connected to the first redistribution layer to electrically connect the first and second connection pads to each other, and a second connection structure including a second insulating layer disposed on the first connection structure to cover at least a portion of the first redistribution layer and to embed the interconnection bridge, a second redistribution layer disposed on the second insulating layer, and a second connection structure penetrating through the second insulating layer and electrically connecting the first and second redistribution layers to each other. The first connection vias are in physical contact with the respective first and second connection pads.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
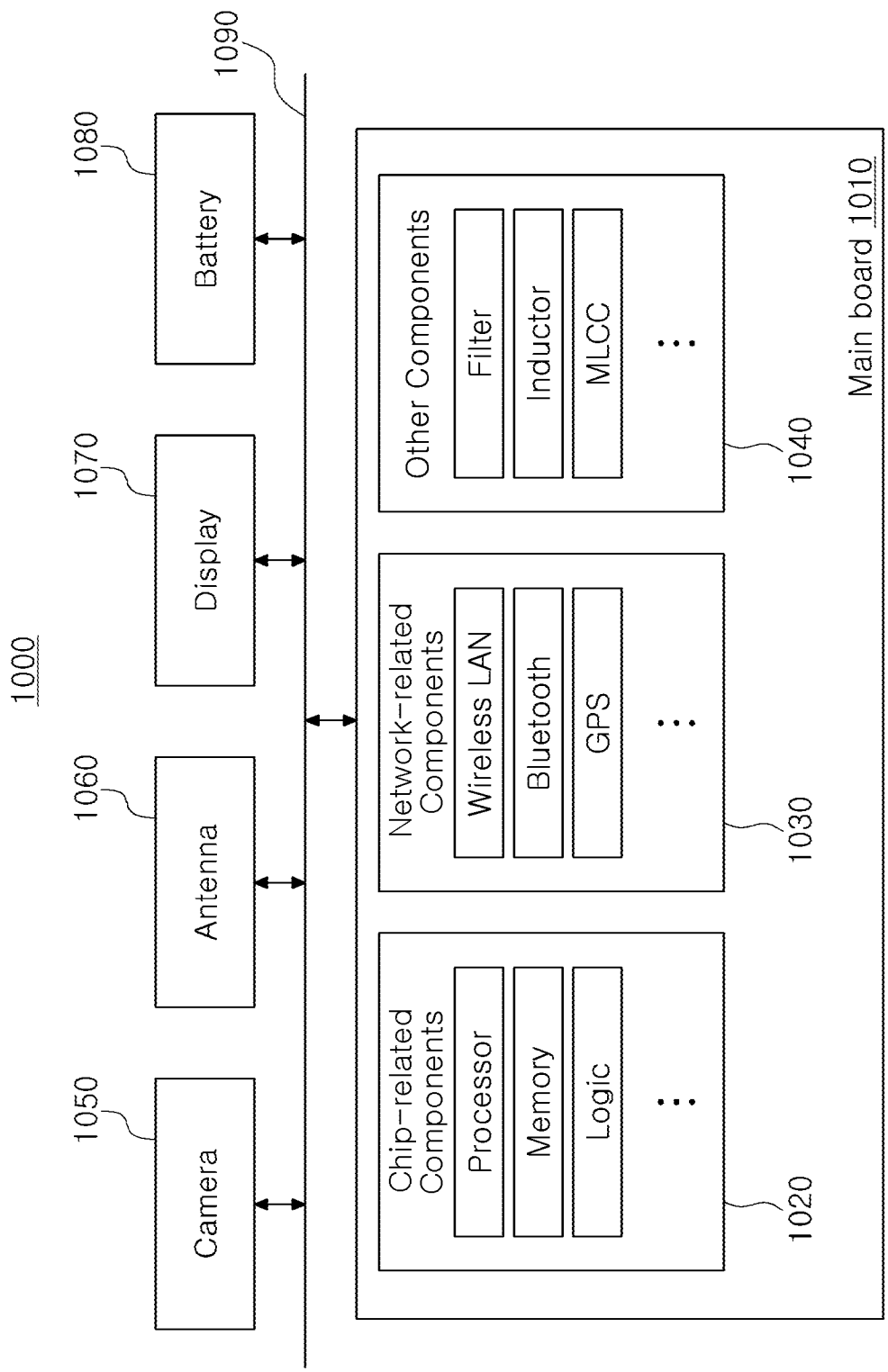
FIG. 1 is a block diagram schematically illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
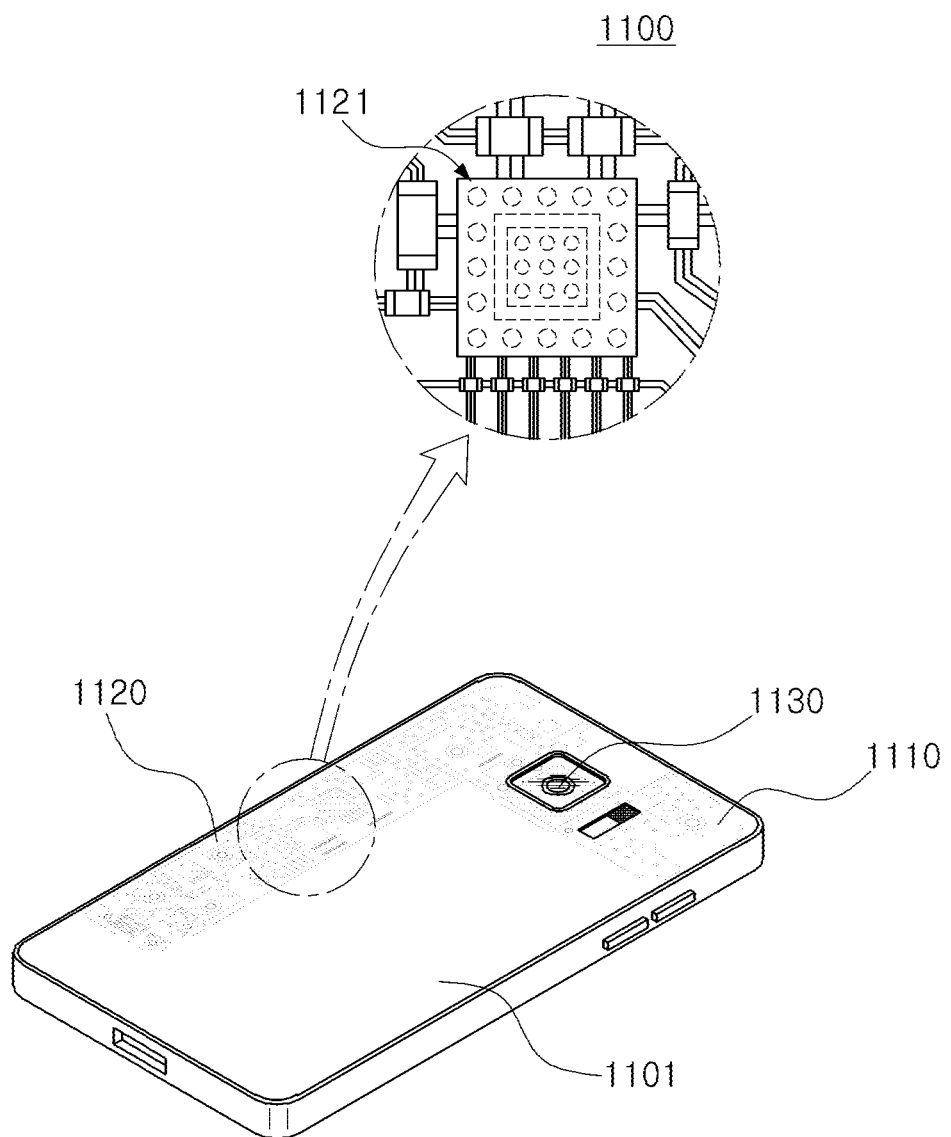
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

Hereinafter, among semiconductor packages manufactured by such a packaging technology, a semiconductor package using an interposer will be described more fully with reference to accompanying drawings.

Figure 3:
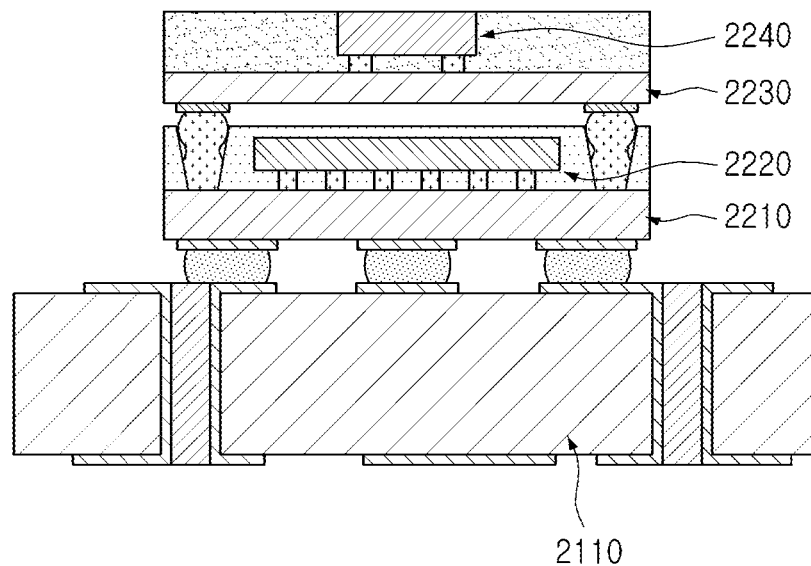
FIG. 3 is a schematic cross-sectional view illustrating a case in which a 3D BGA package is mounted on a mainboard of an electronic device.

FIG. 3 is a schematic cross-sectional view illustrating a case in which a 3D BGA package is mounted on a mainboard of an electronic device.

Among semiconductor chips, an application specific integrated circuit (ASIC) such as a graphics processing unit (GPU) is very expensive. Therefore, it is significantly important to package ASICs at high yield. In this regard, a ball grid array (BGA) may be prepared to redistribute thousands to hundreds of thousands of connection pads before mounting a semiconductor chip. An expensive semiconductor chip, such as a GPU 2220 or the like, may be mounted on a BGA substrate 220 using a surface-mount technology (SMT) or the like, and then is packaged. Ultimately, the packaged semiconductor chip may be mounted on a mainboard 2110.

In the case of a GPU 2220, it is necessary to significantly reduce a signal path with a memory such a high bandwidth memory (HBM). To this end, a semiconductor chip such as the HBM 2220 may be packaged after being mounted on an interposer 2230. The packaged semiconductor chip may be laminated on a package, on which the GPU 2220 is mounted, in a package-on-package (PoP) configuration. Unfortunately, a thickness of a device may be significantly increased, and there may be a limitation in significantly reducing the signal path.

Figure 4:
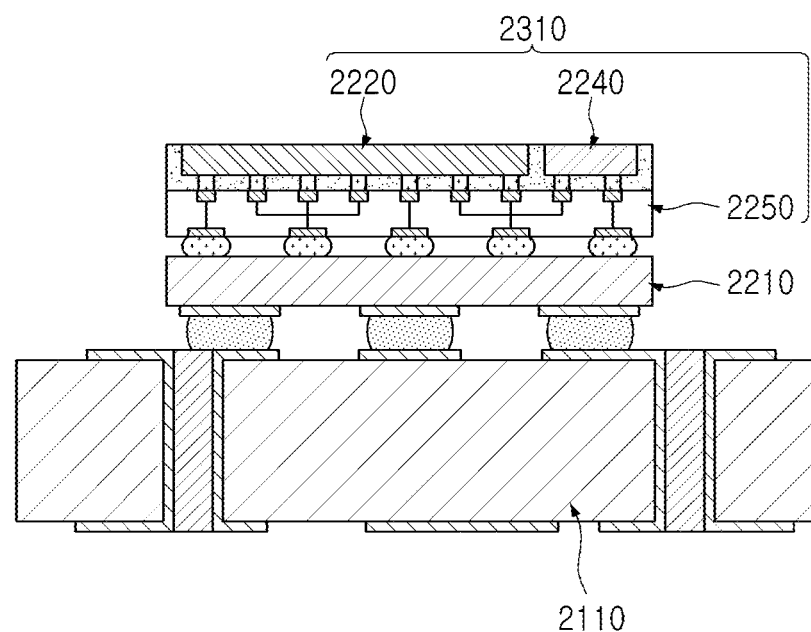
FIG. 4 is a schematic cross-sectional view illustrating a case in which a 2.5D silicon interposer package is mounted on a mainboard.

FIG. 4 is a schematic cross-sectional view illustrating a case in which a 2.5D silicon interposer package is mounted on a mainboard.

In order to address the above issues, a semiconductor package 2310, including an organic interposer, may be manufactured using a 2.5D interposer technology in which a first semiconductor chip such as a GPU 2220 and a second semiconductor chip such as a HBM 2240 are packaged after being surface-mounted side by side on a silicon interposer 2250. In this case, the GPU 2220 and the HBM 2240, having thousands to hundreds of thousands of connection pads, may be redistributed through the interposer 2250 and may be electrically connected via a shortest path. When the semiconductor package 2310, including such an interposer, is redistributed after being mounted again on the BGA substrate 2210, or the like, the semiconductor package 2310 may be ultimately mounted on the mainboard 2110. Since it is significantly difficult to form a through-silicon via (TSV) and manufacturing cost of the silicon interposer 2250 is significantly high, the silicon interposer 2250 may be disadvantageous in larger area and low cost.

Figure 5:
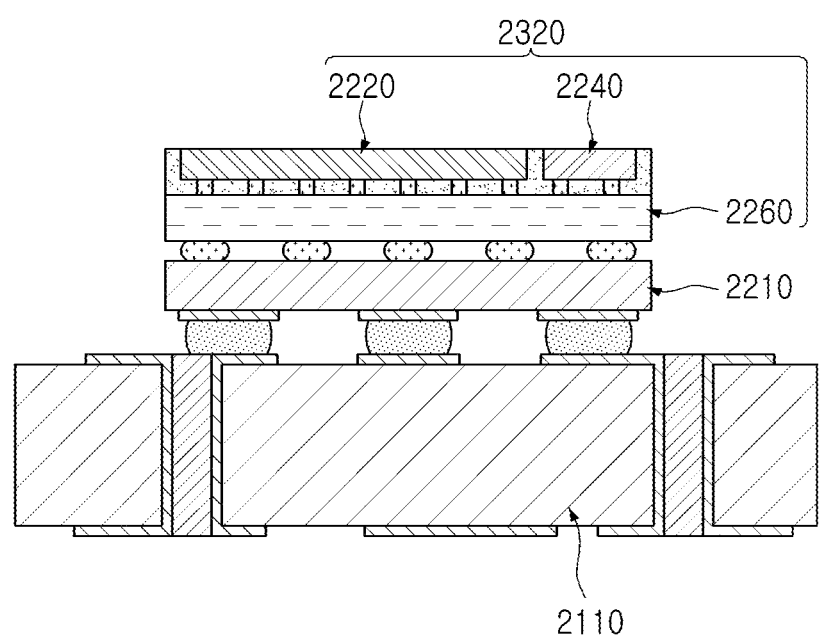
FIG. 5 is a schematic cross-sectional view illustrating a case in which a 2.5D organic interposer package is mounted on a mainboard.

FIG. 5 is a schematic cross-sectional view illustrating a case in which a 2.5D organic interposer package is mounted on a mainboard.

In order to address the above issues, an organic interposer 2260 may be used rather than the silicon interposer 2250. For example, a semiconductor package 2320, including an organic interposer, may be manufactured using a 2.5D interposer technology in which a first semiconductor chip such as a GPU 2220 and a second semiconductor chip such as an HBM 2240 are packaged after being surface-mounted side by side on the organic interposer 2260. In this case, the GPU 2220 and the HBM 2240, having thousands to hundreds of thousands of connection pads, may be redistributed through the interposer 2260 and may be electrically connected via a shortest path. When the semiconductor package 2310, including such an organic interposer, is redistributed after being mounted on a BGA substrate 2210, or the like, the semiconductor package 2310 may be ultimately mounted on the mainboard 2110. In addition, the semiconductor package 2310, including such an organic interposer, may be advantageous in large area and low cost. However, the semiconductor package 2310, including such an organic interposer, may suffer from occurrence of warpage, poor underfill resin filling, occurrence of cracking between a die and a molding material, and the like, due to a mismatch of coefficients of thermal expansion (CTE) of the interposer 2260 and chips 2220 and 2240 when a molding process is performed. Moreover, such an organic interposer may be disadvantageous in implementing a fine pattern.

In order to address the above issues, although not illustrated in detail, an interconnection bridge having a fine pattern may be additionally formed and inserted into a cavity of a BGA substrate to be embedded. However, since it is difficult to form the cavity and to implement a corresponding fine circuit in the BGA substrate, process and yield issues may be reduced. Accordingly, there is a need for a novel semiconductor package capable of addressing all the issues.

Figure 6:
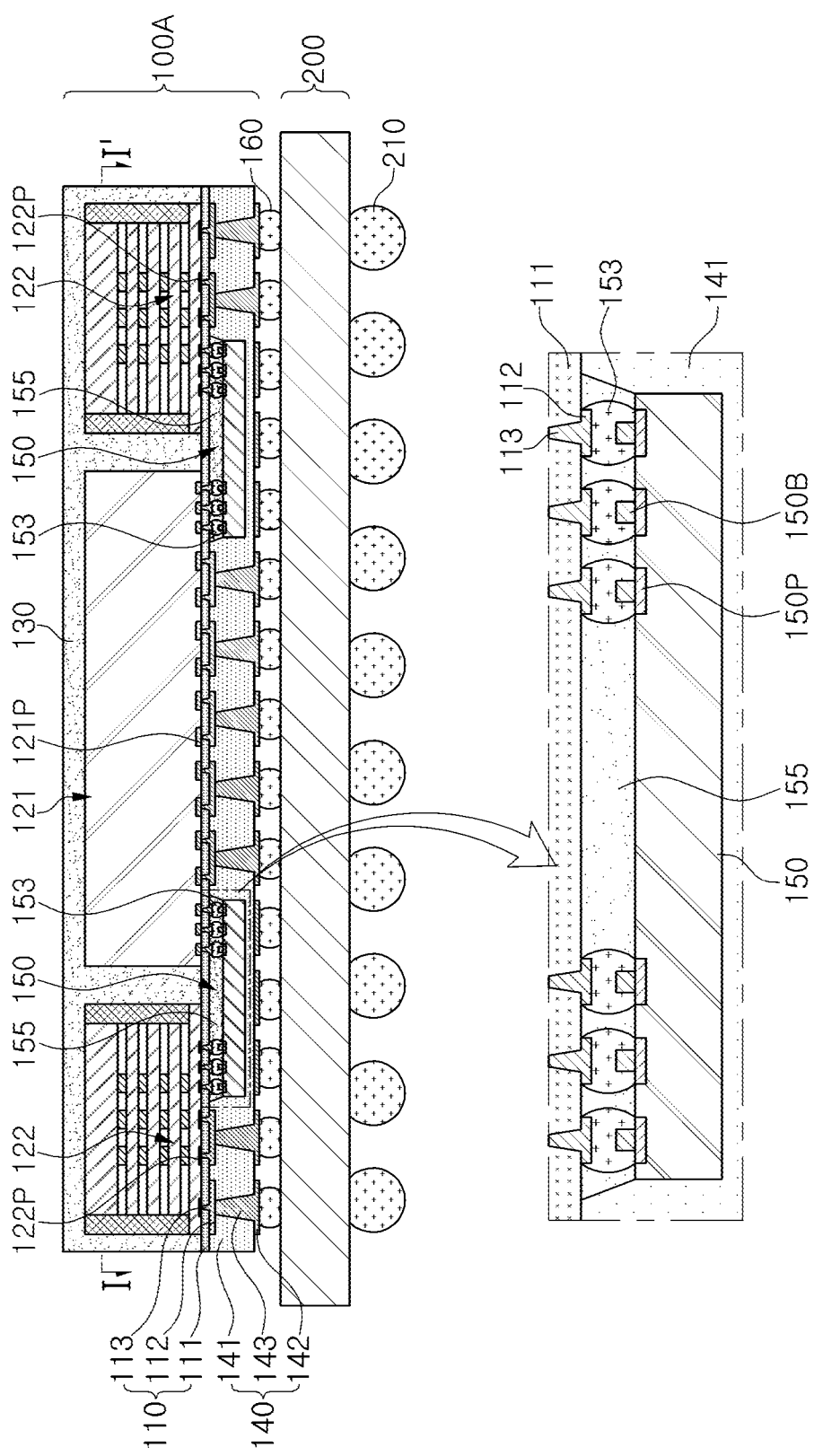
FIG. 6 is a schematic cross-sectional view illustrating an example of a semiconductor package.
Figure 7:
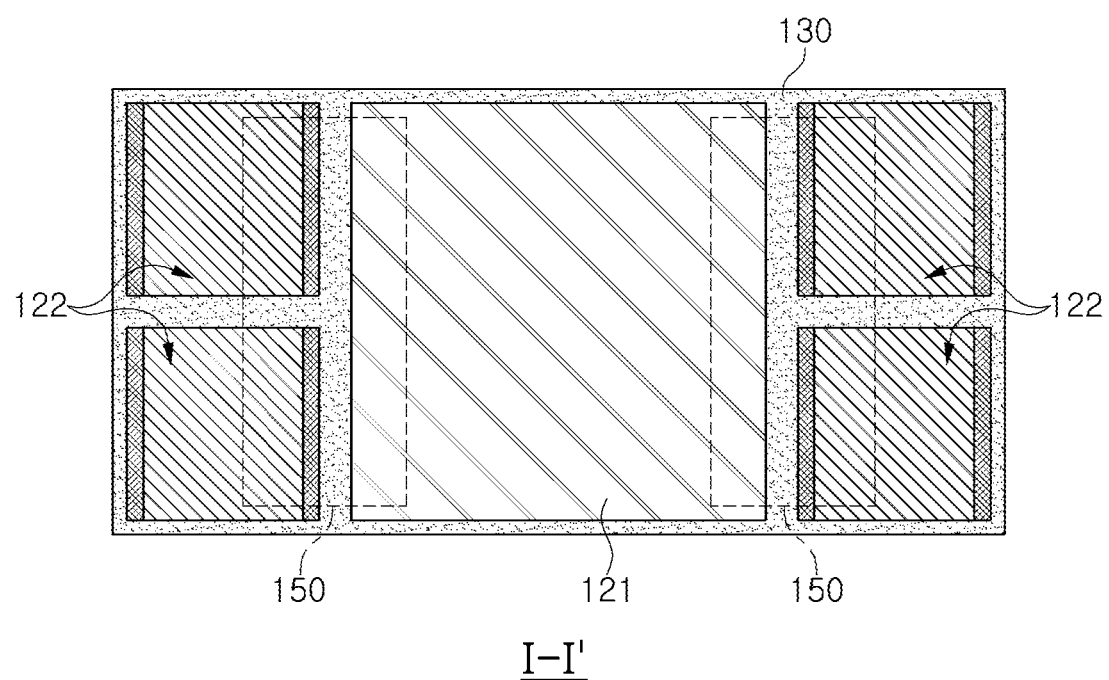
FIG. 7 is a cutaway plan view taken along line I-I' of the semiconductor package in FIG. 6.

FIG. 6 is a schematic cross-sectional view illustrating an example of a semiconductor package, and FIG. 7 is a cutaway plan view taken along line I-I' of the semiconductor package in FIG. 6.

Referring to FIGS. 6 and 7, a semiconductor package 100A according to an example embodiment includes a first connection structure 110 having a first surface and a second surface opposing the first surface and including a first redistribution layer 112, a first semiconductor chip 121, disposed on the first surface of the first connection structure 110, having a first connection pad 121P electrically connected to the first redistribution layer 112, a second semiconductor chip 122, disposed around the first semiconductor chip 121 on the first surface of the first connection structure 110, having a second connection pad 122P electrically connected to the first redistribution layer 112, an interconnection bridge 150 disposed on the second surface of the first connection structure 110 to be spaced apart from the second surface of the first connection structure 110 and connected to the first redistribution layer 112 through a connection member 153 to electrically connect the first and second connection pads 121P and 122P to each other, and a second connection structure 140, disposed on the second surface of the first connection structure 110 to embed the interconnection bridge 150, including a second redistribution layer 142 electrically connected to the first redistribution layer 112.

In addition, the semiconductor package 100A may further include an encapsulant 130 disposed on the first surface of the first connection structure 110 to cover at least a portion of each of the first and second semiconductor chips 121 and 122, an insulating material 155 disposed between the second surface of the first connection structure 110 and the interconnection structure 150 to embed at least a portion of the connection member 153, a first electrical connection metal 160 disposed on a side, opposing a side on which the first connection structure 110 is disposed, and electrically connected to the second redistribution layer 142.

As described above, in the semiconductor package 100A, the interconnection bridge 150, having a fine pattern, is manufactured in advance and then is located on the first redistribution layer 112 of the first connection structure 110 in a surface-mount format using a low melting point metal, for example, a connection member 153, including tin (Sn) or a Sn-containing alloy, to be electrically connected. According to the semiconductor package 100A, process and yield issues on a fine pattern substantially do not occur. In addition, due to use of the interconnection bridge 150 having a fine pattern, the number of layers of the respective first and second redistribution layers 112 and 142 of the first and second connection structures 110 and 140 may be significantly decreased, and each of the first and second redistribution layers 112 and 142 may be provided as, for example, only one layer. Thus, improved yield and processability may be achieved.

The semiconductor package 100A may have a structure in which the first connection structure 110 is directly formed on the first and second semiconductor chips 121 and 122. For example, the first connection structure 110 may include a first insulating layer 111 disposed on the first and second semiconductor chips 121 and 122, a first redistribution layer 112 disposed on the first insulating layer 111, and a first connection via 113 penetrating through the first insulating layer 111 and electrically connecting the first redistribution layer 112 to the first and second connection pads 121P and 122P. The first connection via 113 may be in physical contact with the respective first and second connection vias 121P and 122P. For example, the first connection via 113 may directly connect the first redistribution layer 112 to the first and second connection pads 121P and 122P. In this case, the first connection structure 110 may be formed using the first and second semiconductor chips 121 and 122, each having a significant thickness, as a base, which is effective in controlling process warpage. In addition, since the first connection via 113 may be directly formed on the first and second connection pads 121P and 122P without formation of an additional bump, manufacturing cost may be reduced and process difficulty may be lowered, which is advantageous in processability.

On the other hand, a semiconductor package 100A according to an example embodiment may have a structure in which a second connection structure 140 is directly disposed on the first connection structure 110. For example, the second connection structure 140 may include a second insulating layer 141, disposed on the second surface of the first connection structure 110, covering at least a portion of the interconnection bridge 150, a second redistribution layer 142 disposed on the second insulating layer 141, and a second connection via 143 penetrating through the second insulating layer 141 and electrically connecting the first and second redistribution layers 112 and 142 to each other. The second connection via 143 may be in physical contact with the respective first and second redistribution layers 112 and 142. For example, the second connection via 143 may directly connect the first and second redistribution layers 112 and 142 to each other, which may be more effective in controlling process warpage. In addition, the interconnection bridge 150 may be embedded in the second connection structure 140 to be effectively protected and may be thinned. For example, the interconnection bridge 150 may be disposed on a level between surfaces, respectively being in contact with the first and second redistribution layers 112 and 142 of the second connection via 143.

Hereinafter, each component included in the semiconductor package 100A according to an example embodiment will be described more fully with reference to accompanying drawings.

The first connection structure 110 may primarily redistribute the first and second pads 121P and 122P of the first and second semiconductor chips 121 and 122. Tens to hundreds of thousands of connection pads, having various functions, may be redistributed through the first connection structure 110, and may be physically and/or electrically connected to other components depending on the functions thereof. The first connection structure 110 may include a first insulating layer 111 disposed on first and second active surfaces of the first and second semiconductor chips 121 and 122, a first redistribution layer 112 disposed on the first insulating layer 111, and a first connection via 113, penetrating through the first insulating layer 111, connected to the first redistribution layer 112. The first connection via 113 may also be connected to the first and second connection pads 121P and 122P. The first insulating layer 111, the first redistribution layer 112, and the first connection via 113, constituting the first connection structure 110, may be greater in number than those illustrated in the drawings, but may be provided as, for example, only one layer as illustrated in the drawings to secure processability and yield and to implement thinning.

A material of the first insulating layer 111 may be an insulating material. The insulating material may be a photosensitive material such as a photoimageable dielectric (PID). For example, the first insulating layer 111 may be a photosensitive layer. When the first insulating layer 111 has photosensitive properties, the first insulating layer 111 may be further thinned and a fine pitch of the first connection via 113 may be more easily achieved.

The first redistribution layer 112 may serve to primarily redistribute the first and second connection pads 121P and 122P, and may be formed of a metal material such as copper (Cu), aluminum (Al), silver (Ag), tin (Sn), gold (Au), nickel (Ni), lead (Pb), titanium (Ti), or alloys thereof. The first redistribution layer 112 may perform various functions depending on a design of a corresponding layer. For example, the first redistribution layer 112 may include a ground pattern, a power pattern, a signal pattern, and the like. The signal pattern may include various signals, such as data signal and the like, except for the ground pattern, the power pattern, and the like. In addition, the first redistribution layer 112 may include a connection via pad having various uses.

The first connection via 113 may electrically connect the first redistribution layer 112 to the first and second connection pads 121P and 122P. As a result, an electrical path is formed. A material of the first connection via 113 may be a metal material such as copper (Cu), aluminum (Al), silver (Ag), tin (Sn), gold (Au), nickel (Ni), lead (Pb), titanium (Ti), or alloys thereof. The first connection via 143 may be a filled-type via filled with the metal material, or a conformal-type via in which a metal material is formed along a wall surface of a via hole. Moreover, the first connection via 143 may have a tapered shape or the like. The first connection via 113 may also include a via for signal, a via for grounding, a via for power, and the like. The via for grounding and the via for power may be the same via. The first connection via 113 may be in physical contact with the first and second connection pads 121P and 122P.

Each of the first and second semiconductor chips 121 and 122 may also be an integrated circuit (IC) in which hundreds to millions of or more elements are integrated in a single chip. A base material of a body of each of the first and second semiconductor chips 121 and 122 may also be silicon (Si), germanium (Ge), gallium arsenide (GaAs), or the like. Various circuits may be formed on the body of each of the first and second semiconductor chips 121 and 122. The first and second connection pads 121P and 122P may electrically connect the first and second semiconductor chips 121 and 122 to other components. A material forming the first and second connection pads 121P and 122P may also be a metal material such as copper (Cu), aluminum (Al), or the like, but is not limited thereto. A passivation layer, not illustrated, may be formed on the body of each of the first and second semiconductor chips 121 and 122 to expose the first and second connection pad 121P and 122P. The passivation layer may be an oxide layer, a nitride layer, or the like, or a double layer of an oxide layer and a nitride layer. An insulating layer, not illustrated, or the like may be further disposed at a necessary position. The first and second semiconductor chips 121 and 122 may have first and second active surfaces, on which the first and second connection pads 121P and 122P are disposed, and first and second inactive surfaces opposing the first and second active surfaces, respectively.

The first semiconductor chip 121 may be an application specific integrated circuit (ASIC) such as a graphics processing unit (GPU). The second semiconductor chip 122 may be a stacked memory such as a high bandwidth memory (HBM). For example, the first and second semiconductor chips 121 and 122 may be expensive chips, each having hundreds of thousands of I/O, but are not limited thereto. A greater number of second semiconductor chips 122 than first semiconductor chips 121 may be disposed, and may be disposed around the first semiconductor chips 121, respectively. For example, two second semiconductor chips may be disposed on both sides of the first semiconductor chip 121, respectively. However, this is merely an example and is not limited thereto.

The encapsulant 130 may protect the first and second semiconductor chips 121 and 122. An encapsulation form is not limited as long as the encapsulant 130 covers at least a portion of each of the first and second semiconductor chips 121 and 122. For example, the encapsulant 130 may cover first and second inactive surfaces of the first and second semiconductor chips 121 and 122 and at least a portion of a side surface of each of the first and second semiconductor chips 121 and 122. The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material, such as an inorganic filler impregnated in the thermosetting resin and the thermoplastic resin, such as ABF, FR-4, BT, or the like. Alternatively, a photo-imageable encapsulant (PIE) may be used as the insulating material. As necessary, a material, in which a thermosetting resin or a thermoplastic resin is impregnated with an inorganic filler and/or a core material such as a glass fiber, for example, prepreg may also be used as the insulating material.

The second connection structure 140 may provide an electrical connection path for electrically connecting the first and second connection pads 121P and 122P of the first and second semiconductor chips 121 and 122 to an external component such as a printed circuit board (PCB) 200 or the like. The second connection structure 140 may serve to protect an interconnection bridge 150 by embedding the interconnection bridge. The second connection structure 140 includes a second insulating layer 141 disposed on the first connection structure 110, a second redistribution layer 142 disposed on the second insulating layer 141, and a second connection via 143, penetrating through the second insulating layer 141, connected to the second redistribution layer 142. The second connection via 143 may also be connected to the first redistribution layer 112. The second insulating layer 141, the second redistribution layer 142, and the second connection via 143, constituting the first connection structure 110, may be greater in number than those illustrated in the drawings, but may be provided as, in detail, only one layer as illustrated in the drawings to secure processability and yield and to implement thinning.

A material of the second insulating layer 141 may be an insulating material. The insulating material may be a non-photosensitive material such as ABF including an insulating resin and an inorganic filler. For example, the second insulating layer 141 may be a non-photosensitive insulating layer. In this case, the second insulating layer 141 may cover the interconnection bridge 150 in the form of a film having a significantly great thickness to stably embed the interconnection bridge 150. In addition, process warpage may be effectively controlled.

The second redistribution layer 142 may provide a pad region of the first electrical connection metal 160 for electrically connecting the first and second connection pads 121P and 122P to an external component. The second redistribution layer 142 may be formed of a metal material such as copper (Cu), aluminum (Al), silver (Ag), tin (Sn), gold (Au), nickel (Ni), lead (Pb), titanium (Ti), or alloys thereof. The second redistribution layer 142 may perform various functions depending on a design of a corresponding layer. For example, the second redistribution layer 142 may include a ground pattern, a power pattern, a signal pattern, and the like. The signal pattern may include various signals, such as data signal and the like, except for the ground pattern, the power pattern, and the like. In addition, the second redistribution layer 142 may include a via pad and/or an electrical connection metal pad having various uses.

The second connection via 143 may electrically connect the first and second redistribution layers 112 and 142. As a result, a vertical electrical path is formed. A material of the second connection via 143 may be a metal material such as copper (Cu), aluminum (Al), silver (Ag), tin (Sn), gold (Au), nickel (Ni), lead (Pb), titanium (Ti), or alloys thereof. The second connection via 143 may be a filled-type via filled with the metal material, or a conformal-type via in which a metal material is formed along a wall surface of a via hole. Moreover, the second connection via 143 may have a tapered shape or the like. The second connection via 143 may also include a via for signal, a via for grounding, a via for power, and the like. The via for grounding and the via for power may be the same via. The second connection via 143 may be in physical contact with the first and second connection pads 121P and 122P.

The interconnection bridge 150 electrically connects the first and second connection pads 121P and 122P. For example, the interconnection bridge 150 may electrically connect signal pads of the first and second connection pads 121P and 122P to each other. The interconnection bridge 150 may include a fine pattern formed therein. For example, the interconnection bridge 150 may include a body, having an active surface, on which a connection electrode 150P is disposed, and an inactive surface opposing the active surface, and a connection bump 150B disposed on the connection electrode 150P to be electrically connected to the connection member 153. The body may be a silicon-based body in which a fine pattern for interconnection is formed. For example, the interconnection bridge 150 may be a silicon-based interconnection bridge in which a fine circuit is designed. The number of interconnection bridges 150 is not limited and may be greater or smaller than the number of those illustrated in the drawings.

The interconnection bridge 150 is disposed on the first redistribution layer 112 of the first connection structure 110 through the connection member 153 in a surface-mount form. For example, the first redistribution layer 112 of the first connection structure 110 and the interconnection bridge 150 may be spaced apart from each other, and a space therebetween may be filled with an insulating material 155. The insulating material 155 may embed the connection member 153 and may fix the interconnection bridge 150. The insulating material 155 has a region, covering a bottom surface of the first connection structure 110, and a region covering a top surface of the interconnection bridge 150. The region, covering a bottom surface of the first connection structure 110, may have an area larger than an area of the region covering a top surface of the interconnection bridge 150. For example, the insulating material 155 may be applied on a bottom surface of the first connection structure 110 to fix the interconnection bridge 150, and may have a tapered shape, in which a top surface has a width greater than a width of a bottom surface, when viewed from above. Each of the connection electrode 150P and the connection bump 150B may include a known metal material such as copper (Cu), aluminum (Al), or the like. The connection member 150 may include a low melting point metal, for example, tin (Sn) or a Sn-containing alloy. For example, the connection member 150 may be a solder. The insulating material 155 may be an underfill resin including epoxy or the like.

The first electrical connection metal 160 may physically and/or electrically connect the semiconductor package 100A to an external component. For example, the semiconductor package 100A may be mounted on a BGA substrate, or the like, through the first electrical connection metal 160. The first electrical connection metal 160 may be formed of a low melting point metal, for example, a solder or the like, but is merely an example and a material thereof is not limited thereto. The first electrical connection metal 160 may be a land, a ball, a pin, or the like. The first electrical connection metal 160 may be formed of multiple layers or a single layer. The first electrical connection metal 160 may include a copper pillar and a solder when the first electrical connection metal 160 is formed of multiple layers, and may include a tin-silver solder or copper when the first electrical connection metal 160 is formed of a single layer, but is not limited thereto. The number, an interval, a disposition form or the like, of the first electrical connection metal 160 is not limited, and may be sufficiently modified by a person skilled in the art, depending on design. For example, the number of first electrical connection metals 160 may be several tens to several thousands, depending on the number of the first and second connection pads 121P and 122P. However, the number of first electrical connection metals 160 may be several thousands or more or several thousands or less.

The printed circuit board (PCB) 200 may be disposed on a side opposing a side on which the first connection structure 110 of the second connection structure 140 of the semiconductor package 100A is disposed, and may be connected to the first electrical connection metal 160. For example, the semiconductor package 100A may be surface-mounted on the PCB 200 through the first electrical connection metal 160. The PBC 200 may be mounted on a mainboard of an electrical device, or the like, via the second electrical connection metal 210. The PCB 200 may be a BGA substrate, but is not limited thereto. As necessary, the semiconductor package 100A may be manufactured while the PCB 200 and/or the second electrical connection metal 210 are disposed thereon. For example, the semiconductor package 100A may include the PCB 200 and/or the second electrical connection metal 210.

Figure 8:
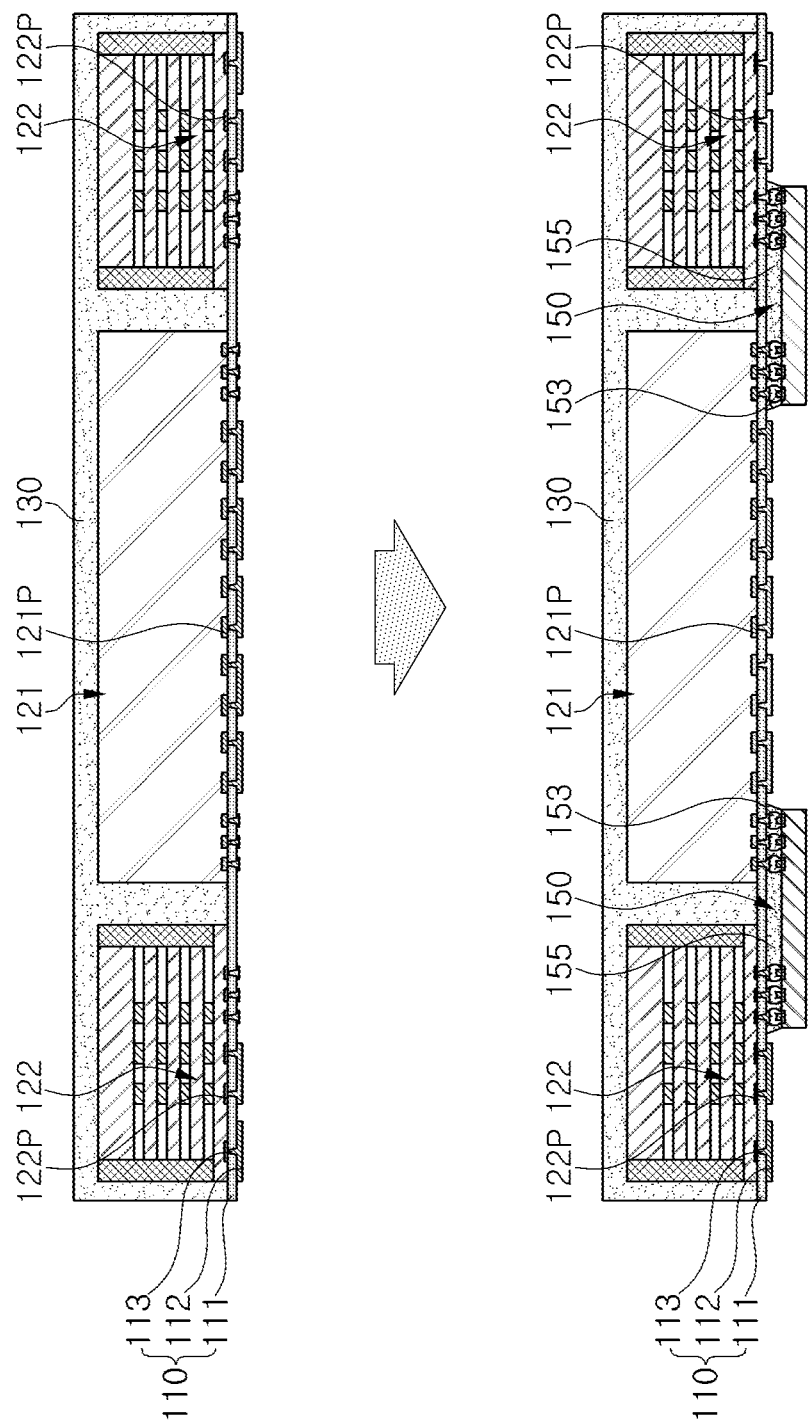
FIGS. 8 and 9 are schematic process diagrams illustrating an example of manufacturing the semiconductor package in FIG. 6.
Figure 9:
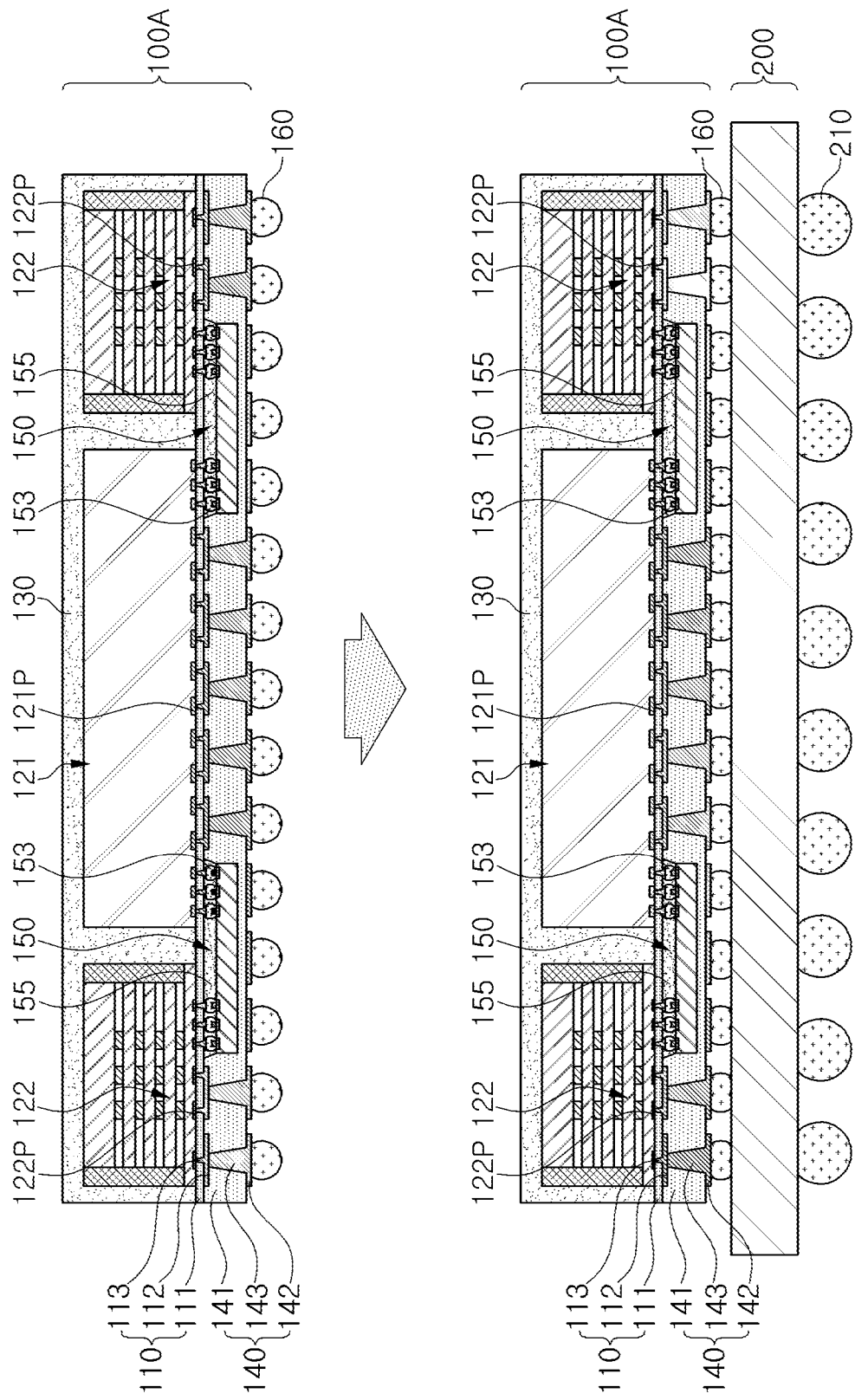

FIGS. 8 and 9 are schematic process diagrams illustrating an example of manufacturing the semiconductor package in FIG. 6.

Referring to FIG. 8, first and second semiconductor chips 121 and 122 are disposed on a tape, not illustrated, or the like in a face-down orientation. The first and second semiconductor chips 121 and 122 are encapsulated by an encapsulant 130 using a manner such as ABF lamination and curing, or the like. By using the first and second semiconductor chips 121 and 122, encapsulated by the encapsulant 130, as a base, a first insulating layer 111 is formed on first and second active surfaces of the respective first and second semiconductor chips 121 and 122 by PID coating and curing. After a via hole is formed by a photolithography process, a first redistribution layer 112 and a first connection via 113 are formed by a plating process, for example, an additive process (AP), a semi-AP (SAP), a modified SAP (MSAP), tenting, or the like. For example, a first connection structure 110 is directly formed on the first and second semiconductor chips 121 and 122. In this case, the first connection via 113 may be in physical contact with the first and second connection pads 121P and 122P. An interconnection bridge 150, capable of electrically connecting the first and second connection pads 121P and 122P, is mounted on the first redistribution layer 112 via a connection member 153, and is fixed using an insulating material 155.

Referring to FIG. 9, a second insulating layer 141 is formed on the first connection structure 110 to embed the interconnection bridge 150 using a manner such as ABF lamination and curing, or the like. After a via hole is formed by laser drilling or the like, a second redistribution layer 142 and a second connection via 143 are formed by the above-mentioned plating process. For example, the second connection structure 140 is directly formed on the first connection structure 110 to embed the interconnection bridge 150. A first electrical connection metal 160 is formed to be connected to the second redistribution layer 142. Through a series of processes, the above-described semiconductor package 100A is manufactured. As necessary, the manufactured semiconductor package 100A may be surface-mounted and disposed on a printed circuit board (PCB) 200, having a second electrical connection metal 210, via the first electrical connection metal 160.

Figure 10:
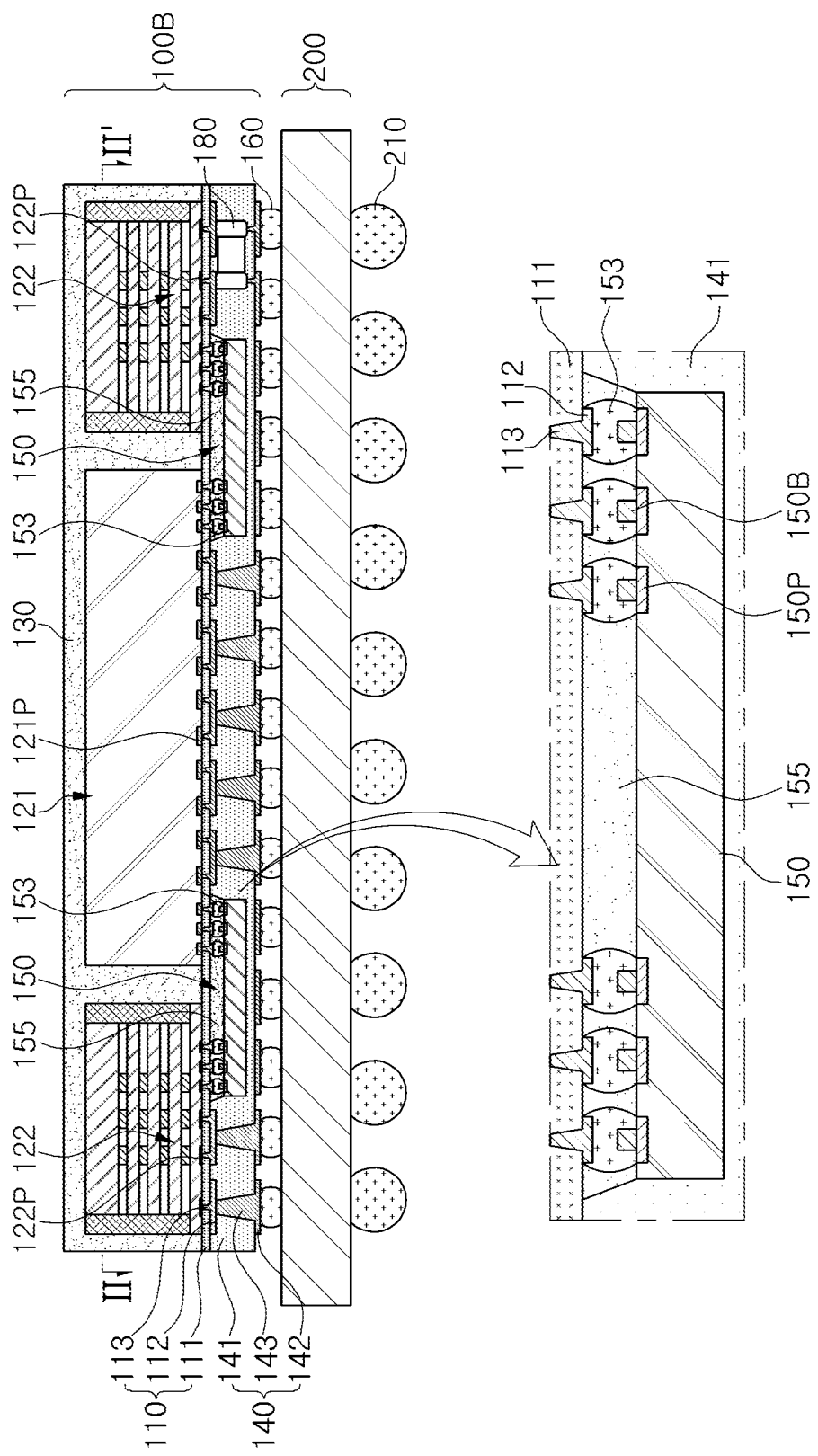
FIG. 10 is a schematic cross-sectional view illustrating another example of a semiconductor package.
Figure 11:
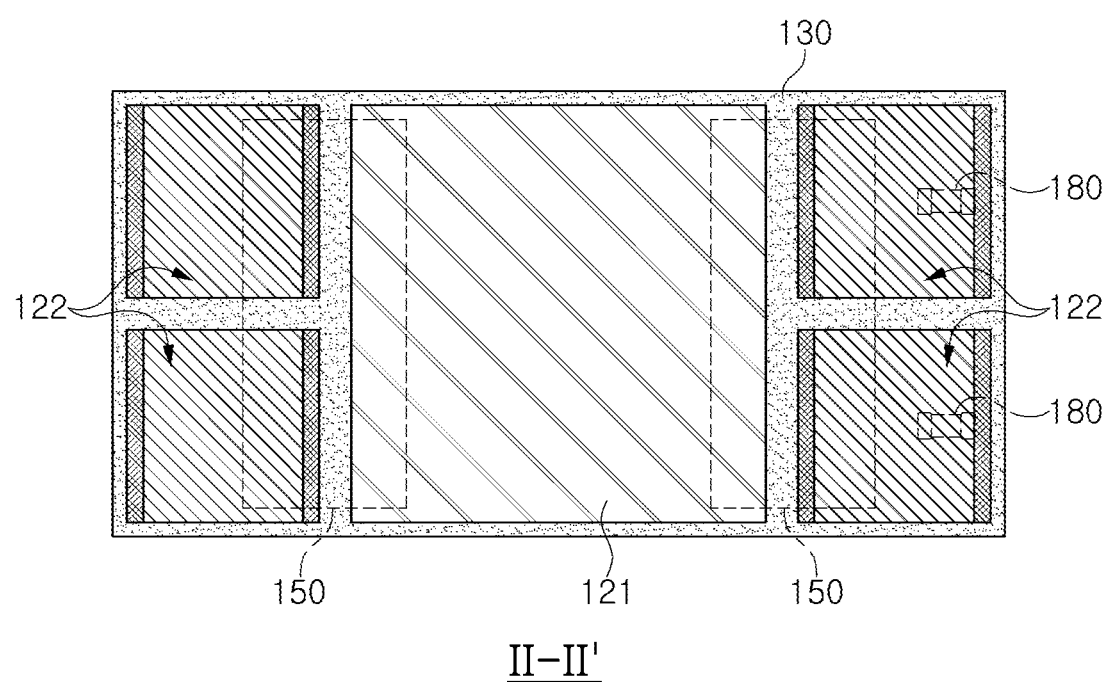
FIG. 11 is a cutaway plan view taken along line II-II' of the semiconductor package in FIG. 10.

FIG. 10 is a schematic cross-sectional view illustrating another example of a semiconductor package, and FIG. 11 is a cutaway plan view taken along line II-II' of the semiconductor package in FIG. 10.

Referring to FIGS. 10 and 11, a semiconductor package 100B according to another example embodiment further includes one or more passive components 180, disposed on a first redistribution layer 112 of a first connection structure 110, as compared to the above-described semiconductor package 100A. Each of the passive components 180 is embedded in a second insulating layer 141 of a second connection structure 140. Each of the passive components 180 is electrically connected to at least one of first and second connection pads 121P and 122P through the first redistribution layer 112. Each of the passive components 180 may include a capacitor and/or an inductor. The other descriptions are substantially the same as the detailed description of the package connection system 100B according to another example embodiment, and will be omitted herein.

As described above, example embodiments provide a semiconductor package which includes a connection structure in which an interconnection bridge, capable of replacing a conventional interposer, is embedded, the semiconductor package may control warpage and may be excellent in yield and processabiliity, low in cost, and free of process and yield issues on a fine pattern.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present disclosure as defined by the appended claims.

What is claimed is:

1. A method of manufacturing a semiconductor package, comprising:
    preparing a first semiconductor chip having a first active surface on which a first connection pad is disposed, and a second semiconductor chip having a second active surface on which a second connection pad is disposed;
    disposing the first and second semiconductor chips on a tape carrier in face-down orientation;
    forming an encapsulant encapsulating the first and second semiconductor chips;
    after removing the tape carrier, forming a first insulating layer on the first and second active surfaces;
    forming a first redistribution layer electrically connected to the first and second connection pads on the first insulating layer;
    surface-mounting an interconnection bridge on the first redistribution layer to electrically connect the first and second connection pads to each other;
    forming a second insulating layer embedding the first redistribution layer and the interconnection bridge on the first insulating layer; and
    forming a second redistribution layer electrically connected to the first redistribution layer on the second insulating layer.

2. The method of manufacturing the semiconductor package of claim 1, wherein a lower surface of the encapsulant, a lower surface of the first connection pad, and a lower surface of the second connection pad are coplanar with each other.

3. The method of manufacturing the semiconductor package of claim 1, wherein each of the first insulating layer and the first redistribution layer is formed as only one layer.

4. The method of manufacturing the semiconductor package of claim 1, further comprising, forming first connection vias penetrating through the first insulating layer and electrically connecting the first redistribution layer to the first and second connection pads.

5. The method of manufacturing the semiconductor package of claim 4, wherein the first connection vias are in physical contact with the respective first and second connection pads.

6. The method of manufacturing the semiconductor package of claim 4, wherein each of the first connection vias is tapered in a direction from the interconnection bridge to the first semiconductor chip or to the second semiconductor chip.

7. The method of manufacturing the semiconductor package of claim 1, wherein the first and second semiconductor chips are electrically connected to each other through the first redistribution layer and the interconnection bridge.

8. The method of manufacturing the semiconductor package of claim 1, wherein the interconnection bridge includes a body having an active surface, on which a connection electrode is disposed, and an inactive surface, opposing the active surface, and a connection bump disposed on the connection electrode,
    the interconnection bridge is surface-mounted in such a manner that the active surface faces the first and second active surfaces.

9. The method of manufacturing the semiconductor package of claim 8, wherein the body is a silicon-based body in which a fine circuit is disposed.

10. The method of manufacturing the semiconductor package of claim 1, wherein each of the second insulating layer and the second redistribution layer is formed as only one layer.

11. The method of manufacturing the semiconductor package of claim 1, further comprising, forming a second connection via penetrating through the second insulating layer and electrically connecting the first redistribution layer to the second redistribution layer.

12. The method of manufacturing the semiconductor package of claim 11, wherein the interconnection bridge is disposed on a level between one surface and another surface, respectively being in contact with the first and second redistribution layers, of the second connection via.

13. The method of manufacturing the semiconductor package of claim 1, further comprising, surface mounting a passive component on the first redistribution layer to be electrically connected to at least one of the first and second connection pads through the first redistribution layer.

14. The method of manufacturing the semiconductor package of claim 1, wherein the first semiconductor chip includes a graphics processing unit (GPU), and
    the second semiconductor chip includes a high bandwidth memory (HBM).

15. The method of manufacturing the semiconductor package of claim 1, wherein the interconnection bridge is spaced apart from the first redistribution layer and is connected to the first redistribution layer through a connection member.

16. A method of manufacturing a semiconductor package, comprising:
    preparing a first semiconductor chip having a first active surface on which a first connection pad is disposed, and a second semiconductor chip having a second active surface on which a second connection pad is disposed;
    forming a first connection structure having a first surface facing the first and second active surfaces and a second surface opposing the first surface and including a first redistribution layer electrically connected to the first and second connection pads;
    disposing an interconnection bridge on the second surface of the first connection structure to be spaced apart from the second surface of the first connection structure and connected to the first redistribution layer through a connection member to electrically connect the first and second connection pads to each other; and forming a second connection structure embedding the interconnection bridge, and including a second redistribution layer electrically connected to the first redistribution layer.

17. The method of manufacturing the semiconductor package of claim 16, further comprising, forming an insulating material disposed between the first connection structure and the interconnection bridge, and embedding at least a portion of the connection member.

18. The method of manufacturing the semiconductor package of claim 16, wherein the first connection structure includes a first insulating layer disposed on the first and second semiconductor chips, the first redistribution layer disposed on the first insulating layer, and first connection vias penetrating through the first insulating layer and respectively, electrically connecting the first redistribution layer to the first and second connection pads.

19. The method of manufacturing the semiconductor package of claim 16, wherein the second connection structure includes a second insulating layer, disposed on the second surface of the first connection structure, covering at least a portion of the interconnection bridge, the second redistribution layer disposed on the second insulating layer, and a second connection via penetrating through the second insulating layer and electrically connecting the first and second redistribution layers to each other.

20. A method of manufacturing a semiconductor package, comprising:

preparing a first semiconductor chip having a first active surface on which a first connection pad is disposed, and a second semiconductor chip having a second active surface on which a second connection pad is disposed;

forming a first connection structure having a first surface facing the first and second active surfaces and a second surface opposing the first surface and including a first redistribution layer electrically connected to the first and second connection pads;

disposing an interconnection bridge on the second surface of the first connection structure to be spaced apart from the second surface of the first connection structure and connected to the first redistribution layer through a connection member to electrically connect the first and second connection pads to each other; and forming a second connection structure embedding the interconnection bridge, and including a second redistribution layer electrically connected to the first redistribution layer;

forming a first electrical connection metal disposed on a side of the second connection structure opposing a side on which the first connection structure is disposed, and electrically connected to the second redistribution layer, disposing a printed circuit board, on the side of the second connection structure opposing the side on which the first connection structure is disposed, and electrically connecting the printed circuit board to the first electrical connection metal; and forming a second electrical connection metal, on a side of the printed circuit board opposing a side on which the second connection structure is disposed, electrically connected to the printed circuit board.

* * * * *